United States Patent
Chen et al.

(10) Patent No.: US 8,937,425 B2
(45) Date of Patent: *Jan. 20, 2015

(54) MECHANICAL RESONATING STRUCTURES INCLUDING A TEMPERATURE COMPENSATION STRUCTURE

(75) Inventors: David M. Chen, Brookline, MA (US); Jan H. Kuypers, Cambridge, MA (US); Alexei Gaidarzhy, Brighton, MA (US); Guiti Zolfagharkhani, Brighton, MA (US)

(73) Assignee: Sand 9, Inc., Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/313,511

(22) Filed: Dec. 7, 2011

(65) Prior Publication Data
US 2012/0074810 A1  Mar. 29, 2012

Related U.S. Application Data

(63) Continuation of application No. 13/290,385, filed on Nov. 7, 2011, which is a continuation of application No. 12/639,161, filed on Dec. 16, 2009, now Pat. No. 8,058,769, application No. 13/313,511, which is a
(Continued)

(51) Int. Cl.
*H03H 9/02* (2006.01)

(52) U.S. Cl.
CPC ....... *H03H 9/02834* (2013.01); *H03H 9/02228* (2013.01); *H03H 9/02448* (2013.01); *H03H 9/02574* (2013.01); *H03H 9/02102* (2013.01)
USPC ...................................... 310/346; 310/313 R

(58) Field of Classification Search
USPC ...... 310/313 R, 313 A, 313 B, 313 C, 313 D, 310/346
See application file for complete search history.

(56) References Cited

U.S. PATENT DOCUMENTS

| 3,916,348 A | 10/1975 | Toda et al. |
| 4,384,409 A | 5/1983 | Lao |
| 4,449,107 A | 5/1984 | Asai et al. |
| 4,454,440 A | 6/1984 | Cullen |

(Continued)

FOREIGN PATENT DOCUMENTS

| JP | 59-064908 | 4/1984 |
| JP | 02-007525 | 2/1990 |

(Continued)

OTHER PUBLICATIONS

Humad et al., "High frequency micromechanical piezo-on-silicon block resonators," Int'l Electron Devices Meeting 2003 IEDM. Technical Digest, Washington, D.C. Dec. 8-10, 2003, New York, NY: IEEE US Dec. 8, 2003, pp. 957-960.

(Continued)

*Primary Examiner* — Derek Rosenau
(74) *Attorney, Agent, or Firm* — Wolf, Greenfield & Sacks, P.C.

(57) ABSTRACT

Mechanical resonating structures are described, as well as related devices and methods. The mechanical resonating structures may have a compensating structure for compensating temperature variations. The compensating structure may have multiple layers, one of which may have a stiffness that increases with increasing temperature and one of which may have a stiffness that decreases with increases in temperature.

16 Claims, 15 Drawing Sheets

Related U.S. Application Data continuation of application No. 13/290,405, filed on Nov. 7, 2011.

(60) Provisional application No. 61/138,171, filed on Dec. 17, 2008.

(56) References Cited

U.S. PATENT DOCUMENTS

| | | | |
|---|---|---|---|
| 4,516,049 A | 5/1985 | Mikoshiba et al. | |
| 4,647,881 A | 3/1987 | Mitsutsuka | |
| 5,129,262 A | 7/1992 | White et al. | |
| 5,914,553 A | 6/1999 | Adams et al. | |
| 5,939,956 A | 8/1999 | Arimura et al. | |
| 6,124,765 A | 9/2000 | Chan et al. | |
| 6,150,748 A | 11/2000 | Fukiharu | |
| 6,420,816 B2 | 7/2002 | Getman et al. | |
| 6,516,665 B1 | 2/2003 | Varadan et al. | |
| 6,566,787 B2 | 5/2003 | Tsukahara et al. | |
| 6,739,190 B2 | 5/2004 | Hsu et al. | |
| 6,828,713 B2 | 12/2004 | Bradley et al. | |
| 6,848,295 B2 | 2/2005 | Auner et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,987,432 B2 | 1/2006 | Lutz et al. | |
| 6,995,622 B2 | 2/2006 | Partridge et al. | |
| 7,005,946 B2 | 2/2006 | Duwel et al. | |
| 7,068,125 B2 | 6/2006 | Lutz et al. | |
| 7,102,467 B2 | 9/2006 | Lutz et al. | |
| 7,211,926 B2 | 5/2007 | Quevy et al. | |
| 7,215,061 B2 | 5/2007 | Kihara et al. | |
| 7,352,608 B2 | 4/2008 | Mohanty et al. | |
| 7,471,028 B2 | 12/2008 | Onozawa | |
| 7,492,241 B2 | 2/2009 | Piazza et al. | |
| 7,504,909 B2 | 3/2009 | Tada | |
| 7,535,152 B2 | 5/2009 | Ogami et al. | |
| 7,724,103 B2 | 5/2010 | Feng et al. | |
| 7,728,483 B2 | 6/2010 | Tanaka | |
| 7,791,432 B2 | 9/2010 | Piazza et al. | |
| 8,058,769 B2 * | 11/2011 | Chen et al. | 310/313 R |
| 8,362,675 B2 | 1/2013 | Chen et al. | |
| 8,629,599 B2 | 1/2014 | Chen et al. | |
| 2002/0075100 A1 | 6/2002 | Katohno | |
| 2004/0065940 A1 | 4/2004 | Ayazi et al. | |
| 2005/0073078 A1 | 4/2005 | Lutz et al. | |
| 2005/0151600 A1 * | 7/2005 | Takeuchi et al. | 333/191 |
| 2006/0279175 A1 | 12/2006 | Aigner | |
| 2007/0052324 A1 | 3/2007 | Chen et al. | |
| 2007/0222336 A1 | 9/2007 | Grannen et al. | |
| 2008/0048804 A1 | 2/2008 | Volatier et al. | |
| 2008/0143217 A1 | 6/2008 | Ho et al. | |
| 2008/0186109 A1 | 8/2008 | Ho et al. | |
| 2008/0204153 A1 | 8/2008 | Yoshida et al. | |
| 2008/0272852 A1 | 11/2008 | Six | |
| 2008/0284286 A1 | 11/2008 | Ogawa et al. | |
| 2008/0297281 A1 * | 12/2008 | Ayazi et al. | 333/192 |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0026136 A1 | 2/2010 | Gaidarzhy et al. | |
| 2010/0038991 A1 | 2/2010 | Shih et al. | |
| 2010/0134207 A1 | 6/2010 | Mohanty et al. | |
| 2010/0155883 A1 | 6/2010 | Wenzler et al. | |
| 2010/0181868 A1 | 7/2010 | Gaidarzhy et al. | |
| 2010/0319185 A1 | 12/2010 | Ayazi et al. | |
| 2012/0049965 A1 * | 3/2012 | Chen et al. | 331/66 |
| 2012/0049980 A1 | 3/2012 | Chen et al. | |

FOREIGN PATENT DOCUMENTS

| | | |
|---|---|---|
| JP | 10-209801 | 8/1998 |
| JP | 2005-142902 | 6/2005 |
| JP | 2006-042116 | 2/2006 |
| JP | 2006-190797 A | 7/2006 |
| JP | 2006-286711 A | 10/2006 |
| JP | 2008-098974 | 4/2008 |
| JP | 2008-258884 | 10/2008 |
| WO | WO 98/01948 A1 | 1/1998 |
| WO | WO 02/17481 A2 | 2/2002 |
| WO | WO 2004/095696 | 11/2004 |
| WO | WO 2006/000611 A1 | 1/2006 |
| WO | WO 2006/083482 A2 | 8/2006 |
| WO | WO 2007/072408 A2 | 6/2007 |
| WO | WO 2007/072409 A2 | 6/2007 |
| WO | WO 2007/143520 A2 | 12/2007 |
| WO | WO 2010/011288 A1 | 1/2010 |

OTHER PUBLICATIONS

International Search Report and Written Opinion for International Application No. PCT/US09/06590 mailed Mar. 1, 2010.

International Search Report and Written Opinion for International Application No. PCT/US09/06587 mailed Feb. 26, 2010.

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

European Search Report and Opinion from EP09836502, mailed Jul. 20, 2012.

Kuypers, J., et al., "Intrinsic temperature compensation of aluminum nitride Lamb wave resonators for multiple-frequency references", Frequency Control Symposium, 2008 IEEE International, pp. 240-249.

Lakin, K., et al., "Temperature compensated bulk acoustic thin film resonators", Proceedings/2000 IEEE Ultrasonics Symposium, 2000, vol. 1, pp. 855-858.

Yu., et al., "Ultra Temperature-Stable Bulk-Acoustic-Wave Resonators with SiO2 Compensation Layer", IEEE Transactions on Ultrasonics, Ferroelectrics and Frequency Control, vol. 54, No. 10, 2007, pp. 2102-2109.

Spriggs, R. M. et al., "Mechanical Properties of Pure, Dense Aluminum Oxide as a Function of Temperature and Grain Size," Journal of the American Ceramic Society, Jul. 1964, pp. 323-327, vol. No. 47, Issue No. 7.

Notification of Reasons for Rejection, Japanese Patent Application No. 2011-542128, Jul. 30, 2013.

Office Communication mailed May 20, 2014 for Japanese Application No. 2011-542128.

* cited by examiner

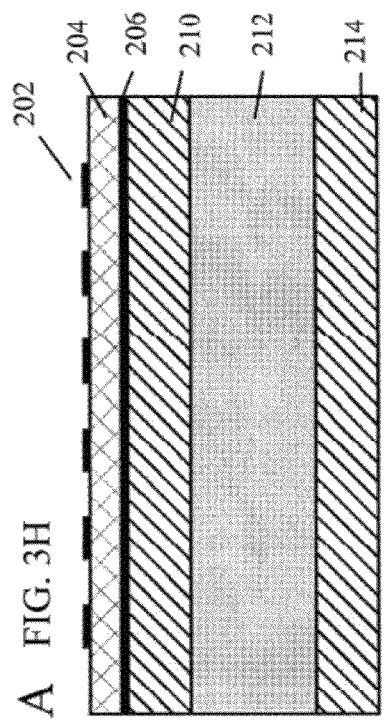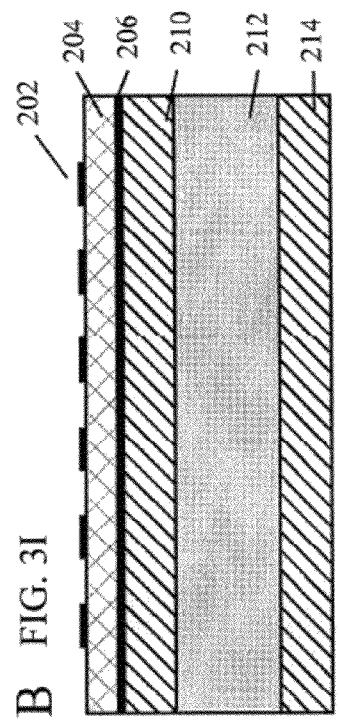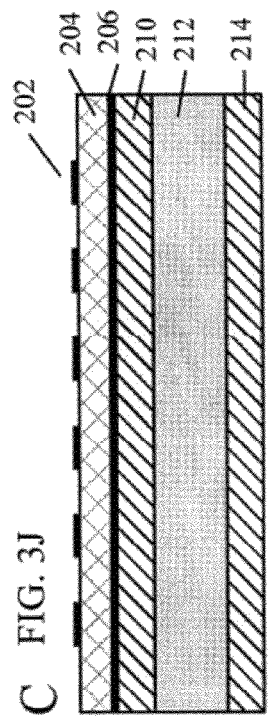

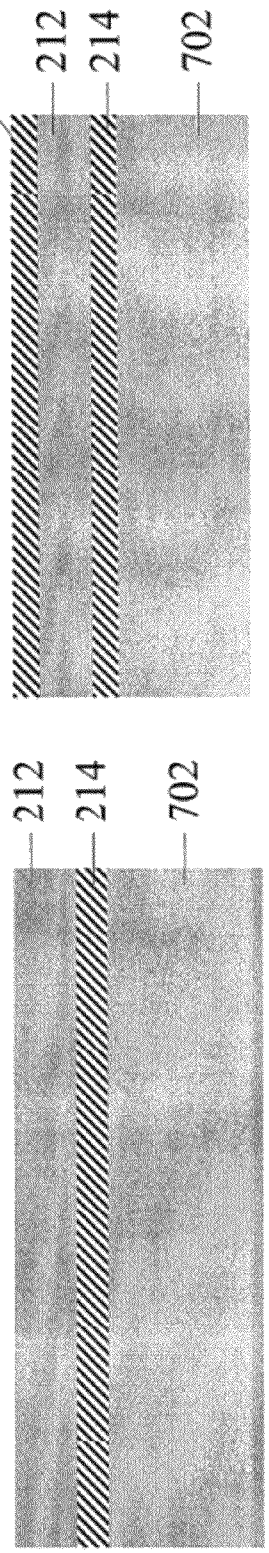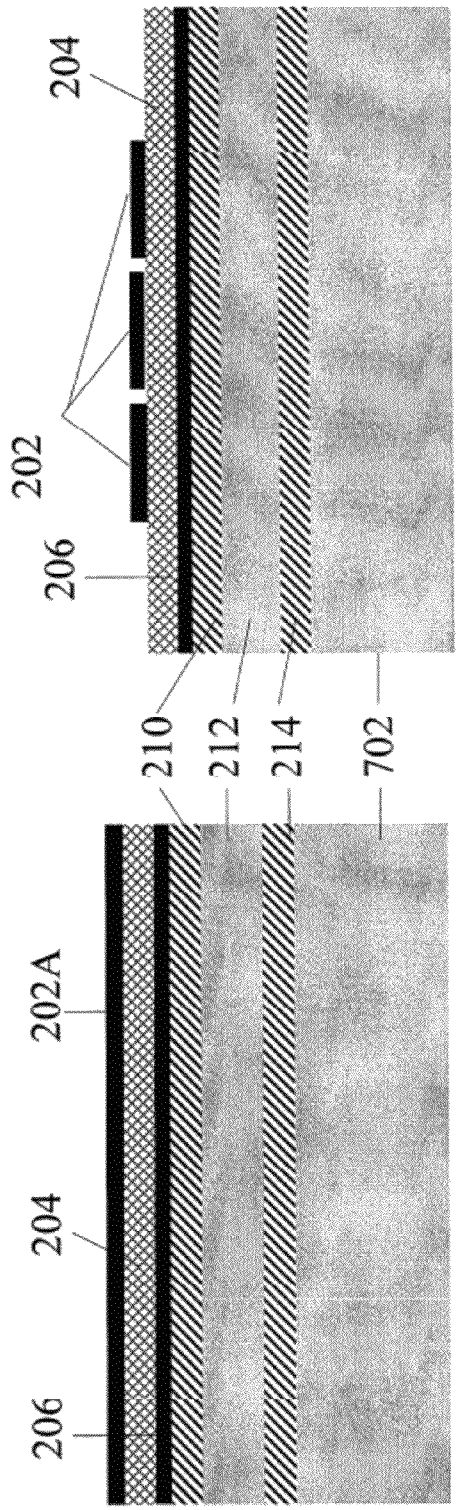
FIG. 7A
FIG. 7B
FIG. 7C
FIG. 7D

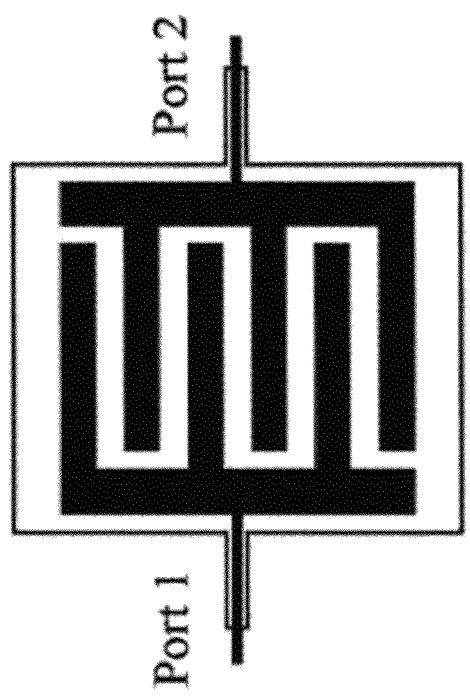
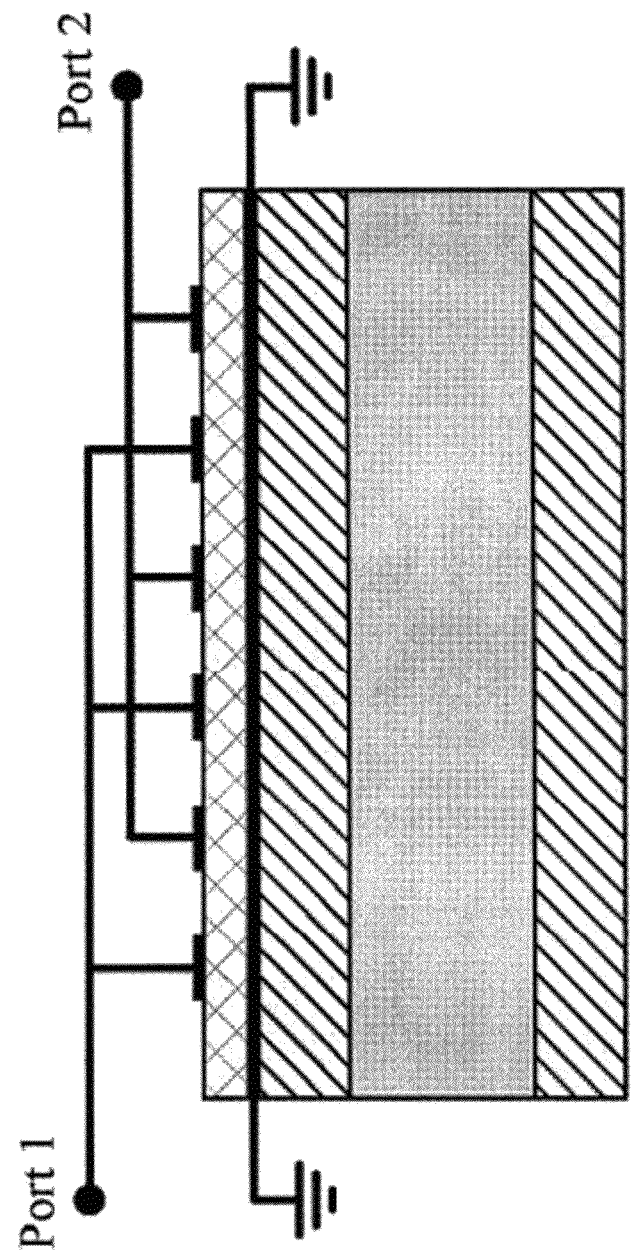
FIG. 9A
FIG. 9B

MECHANICAL RESONATING STRUCTURES INCLUDING A TEMPERATURE COMPENSATION STRUCTURE

RELATED APPLICATIONS

The present application claims the benefit under 35 U.S.C. §120 as a continuation of U.S. patent application Ser. No. 13/290,385 filed Nov. 7, 2011 and entitled "Mechanical Resonating Structures Including a Temperature Compensation Structure," the entire contents of which is incorporated herein by reference.

Application Ser. No. 13/290,385 claims the benefit under 35 U.S.C. §120 as a continuation of U.S. patent application Ser. No. 12/639,161 filed Dec. 16, 2009 and entitled "Mechanical Resonating Structures Including a Temperature Compensation Structure," now U.S. Pat. No. 8,058,769, which claims the benefit of U.S. Provisional Application No. 61/138,171 filed Dec. 17, 2008 and entitled "Mechanical Resonating Structures Including a Temperature Compensation Structure," the entire contents of both of which are incorporated herein by reference.

The present application also claims the benefit under 35 U.S.C. §120 as a continuation of U.S. patent application Ser. No. 13/290,405 filed Nov. 7, 2011 and entitled "Mechanical Resonating Structures Including a Temperature Compensation Structure," the entire contents of which is incorporated herein by reference.

Application Ser. No. 13/290,405 claims the benefit under 35 U.S.C. §120 as a continuation of U.S. patent application Ser. No. 12/639,161 filed Dec. 16, 2009 and entitled "Mechanical Resonating Structures Including a Temperature Compensation Structure," now U.S. Pat. No. 8,058,769, which claims the benefit of U.S. Provisional Application No. 61/138,171 filed Dec. 17, 2008 and entitled "Mechanical Resonating Structures Including a Temperature Compensation Structure," the entire contents of both of which are incorporated herein by reference.

FIELD OF INVENTION

The invention relates generally to mechanical resonating structures, and more particularly, to mechanical resonating structures having a temperature compensation structure, as well as related devices and methods.

BACKGROUND OF INVENTION

Mechanical resonators are physical structures that are designed to vibrate at high frequencies. Such resonators may be incorporated into a variety of devices such as timing oscillators, mass sensors, gyros, accelerometers, switches, and electromagnetic fuel sensors, amongst others.

During use, mechanical resonators, and the devices which incorporate the same, may be exposed to different temperature conditions and variations. Such conditions and variations can cause material expansion and contraction, as well as changes in material stiffness. This can result in a variation in vibrational characteristics (e.g., resonating to frequency) across the temperature range. These effects also can lead to increased noise, reduction in bandwidth, deterioration of signal quality and can, in general, create stability problems in devices.

The temperature stability of a mechanical resonator may be quantified as the temperature coefficient of frequency (TCF), which is expressed as: $TCF = (1/f)(\partial f/\partial T)$, where f is the resonance frequency and T is the temperature. Another term that is used to quantify the stiffness component of the temperature stability of a mechanical resonator (which is one of the primary contributors to TCF) is the temperature coefficient of stiffness (TCS), which can be expressed as: $TCS = (1/C_{\mathit{eff}})(\partial C_{\mathit{eff}}/\partial T)$, where $C_{\mathit{eff}}$ is the effective stiffness coefficient of the resonator.

To address the effects resulting from temperature change, it can be advantageous for mechanical resonating structures to have temperature compensation capabilities to improve the stability of such structures, and associated devices, over a range of temperatures.

SUMMARY OF INVENTION

Mechanical resonating structures, as well as related devices and methods, are described herein.

In one aspect, a device is provided comprising a mechanical resonating structure. The mechanical resonating structure includes an active layer and a compensating structure coupled to the active layer. The compensating structure comprises a first layer having a stiffness that increases with increasing temperature over at least a first temperature range, a third layer having a stiffness that increases with increasing temperature over at least the first temperature range, and a second layer between the first layer and the third layer.

According to another aspect, a device is provided comprising a mechanical resonating structure. The mechanical resonating structure comprises an active layer and a compensation structure coupled to the active layer and configured to compensate temperature-induced variations in stiffness of at least the active layer. The compensation structure comprises a first layer, a second layer, and a third layer. The first and third layers are formed of a first material and the second layer is formed of a second material different than the first material. The second layer is disposed between the first layer and the second layer.

This Summary is not exhaustive of the scope of the various aspects of the present invention described herein. Moreover, this Summary is not intended to be limiting of the various aspects and should not be interpreted in that manner. While certain embodiments have been described and/or outlined in this Summary, it should be understood that the various aspects are not limited to such embodiments, description and/or outline, nor are the claims limited in such a manner. Indeed, many others embodiments, which may be different from and/or similar to, the embodiments presented in this Summary, will be apparent from the description, illustrations and claims which follow. In addition, although various features, attributes and advantages have been described in this Summary and/or are apparent in light thereof, it should be understood that such features, attributes and advantages are not required whether in one, some or all of the embodiments and, indeed, need not be present in any of the embodiments of the various aspects.

Other aspects, embodiments and features of the invention will become apparent from the following detailed description of the invention when considered in conjunction with the accompanying drawings. All patent applications and patents incorporated herein by reference are incorporated by reference in their entirety. In case of conflict, the present specification, including definitions, will control.

BRIEF DESCRIPTION OF THE DRAWINGS

FIGS. 3H-3J show diagrams of mechanical resonating structures with different layer thicknesses having a zero temperature coefficient of frequency at room temperature and varying non-linear temperature coefficients of frequency according to embodiments of the present invention.

FIGS. 7A-7F illustrate steps for fabricating a mechanical resonating structure using a second method according to embodiments of the present invention.

FIGS. 9A-9B illustrate a two-port mechanical resonating structure according to embodiments of the present invention.

Figure 1:
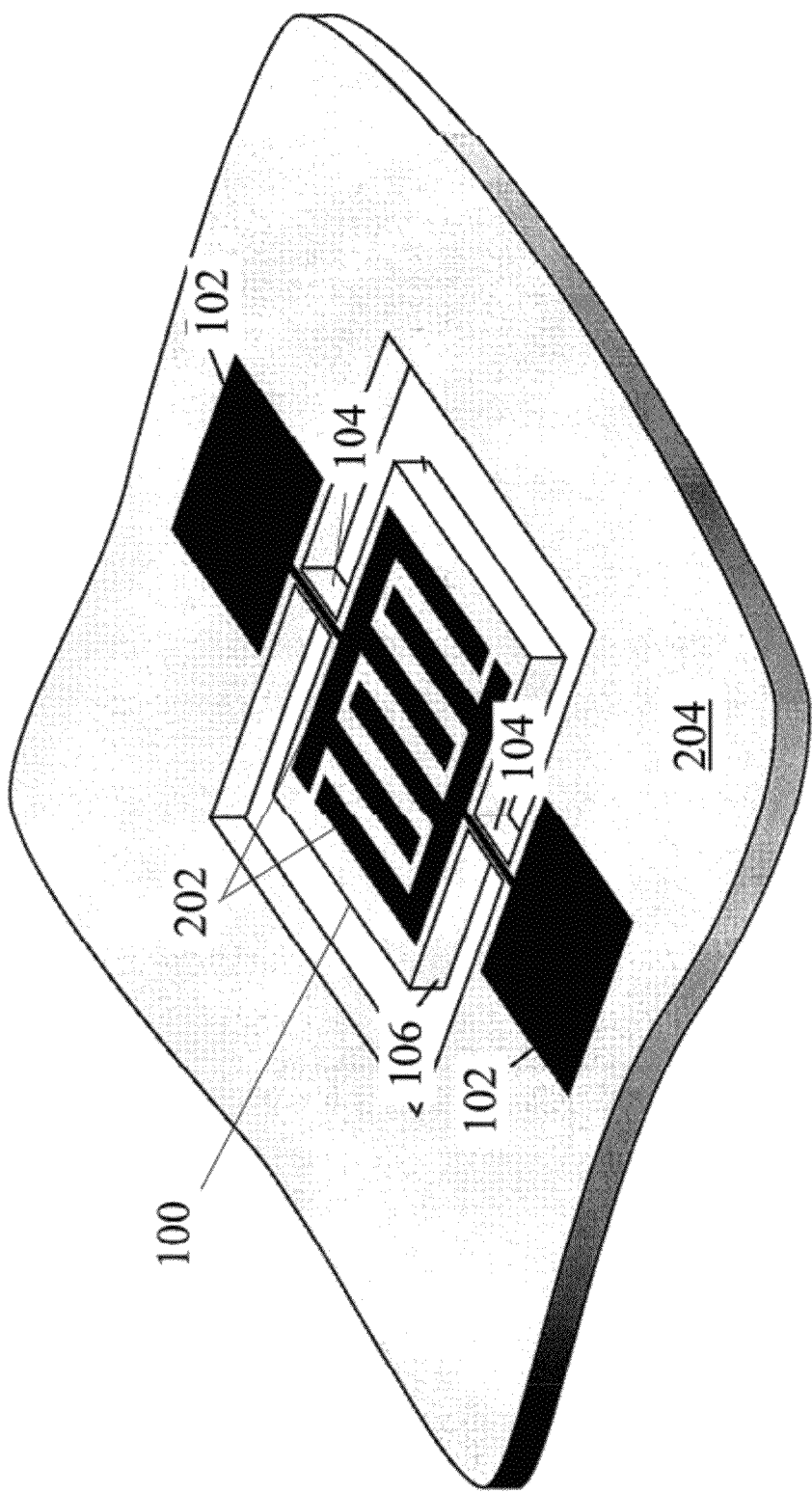
FIG. 1 shows a 3-D top view of a mechanical resonating structure according to embodiments of the present invention.

In the drawings, the same reference numbers identify identical or substantially similar elements or acts. The drawings illustrate particular embodiments for the purpose of describing the claimed invention, and are not intended to be exclusive or limiting in any way. The figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention.

In the course of the detailed description to follow, reference will be made to the attached drawings. These drawings show different aspects of the present invention and, where appropriate, reference numerals illustrating like structures, components, materials and/or elements in different figures are labeled similarly. It should be understood that various combinations of the structures, components, materials and/or elements, other than those specifically shown, are contemplated and are within the scope of the present inventions.

DETAILED DESCRIPTION

Mechanical resonating structures, as well as related devices and methods, are described herein. The mechanical resonating structures include an active layer comprising an active material (e.g., a piezoelectric material). For example, the active layer may be formed of a piezoelectric material. The stiffness of the active layer generally varies across the range of temperature to which the mechanical resonating structures are exposed during use. As described further below, the mechanical resonating structures include a compensating structure that can be designed to have a stiffness variation with temperature such that it balances the stiffness variation with temperature of the active layer and/or any additional layers of the mechanical resonating structure (e.g., electrode layers, support layers, or any other layers of the mechanical resonating structure) to give the mechanical resonating structure a targeted stiffness variation over the temperature range. According to one aspect, the compensating structure can be designed such that the mechanical resonating structure has a desired frequency variation with temperature, for example by compensating for any one or more (including all) of the following: temperature-induced variations in stiffness of the materials of the mechanical resonating structure; temperature-induced expansion and/or contraction of materials; stresses caused by different coefficients of thermal expansion of different materials of the mechanical resonating structure; interfacial stresses arising from interfaces between materials of the mechanical resonating structure; stresses generated by a substrate and/or anchors connected to the mechanical resonating structure (in those embodiments in which the mechanical resonating structure is coupled to a substrate by anchors); and stresses arising from packaging of the mechanical resonating structure. For example, the compensating structure can be designed so that the resonant frequency of the mechanical resonating structure does not vary much, or at all, over a wide temperature range (e.g., TCF approaches, or is equal to 0). The compensation, thus, can significantly reduce undesirable effects that would result from such variation including a deterioration in signal quality and stability, amongst others.

FIG. 1 shows a mechanical resonating structure 100 according to an embodiment. The mechanical resonating structure is connected to pads 102 via anchors 104 according to this embodiment. As described further below, the mechanical resonating structure vibrates in response to a source of excitation (e.g., application of an electrical potential), and in some embodiments is configured (shaped, sized, etc.) to support one or more modes of Lamb waves. The mechanical vibration of the mechanical resonating structure may be converted to an electrical output signal which, for example, may be further processed. The mechanical resonating structure can generate signals with multiple modes and resonant frequencies, and, as mentioned, in some embodiments may be configured to support one or more modes of Lamb waves, although not all embodiments are limited in this respect. Typically, one of the modes can dominate and the mechanical resonating structure can vibrate at the resonant frequency associated with the dominant mode. The mechanical resonating structure can include a resonating structure plate 106 and interdigital transducer (IDT) electrodes 202. The mechanical resonating structure can include an active layer 204, as described further below.

The frequency produced by the mechanical resonating structure may vary depending on the design and application. For example, the frequency produced may be between a 1 kHz and 10 GHz. In some embodiments, for example, the frequencies are in the upper MHz range (e.g., greater than 100 MHz), or at least 1 GHz (e.g., between 1 GHz and 10 GHz). In some cases, the signal may have a frequency of at least 1 MHz (e.g., 13 MHz, 26 MHz) or, in some cases, at least 32 kHz.

The dimensions of the mechanical resonating structure depend, in part, on the desired performance including the desired frequency. According to some embodiments, the mechanical resonating structure can be a micromechanical resonator. The mechanical resonating structure may have a "large dimension" (i.e., the largest of the length, width, thickness, etc.) of less than 1 mm; in some cases, the large dimension is less than 500 micron, or less than 100 micron, or less than 10 micron.

Figure 8A:
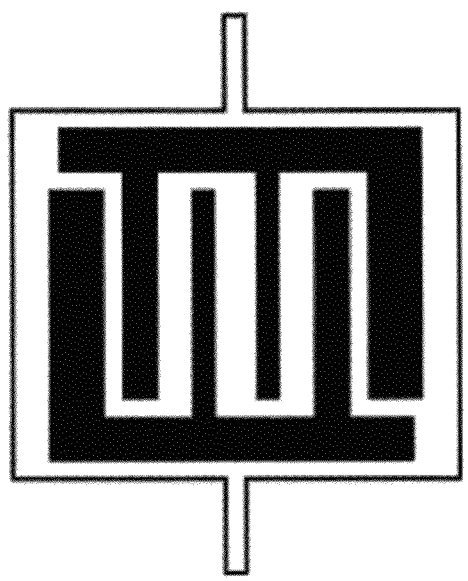
FIGS. 8A-8B show configurations of a mechanical resonating structure that suppress spurious frequencies according to embodiments of the present invention.
Figure 8B:
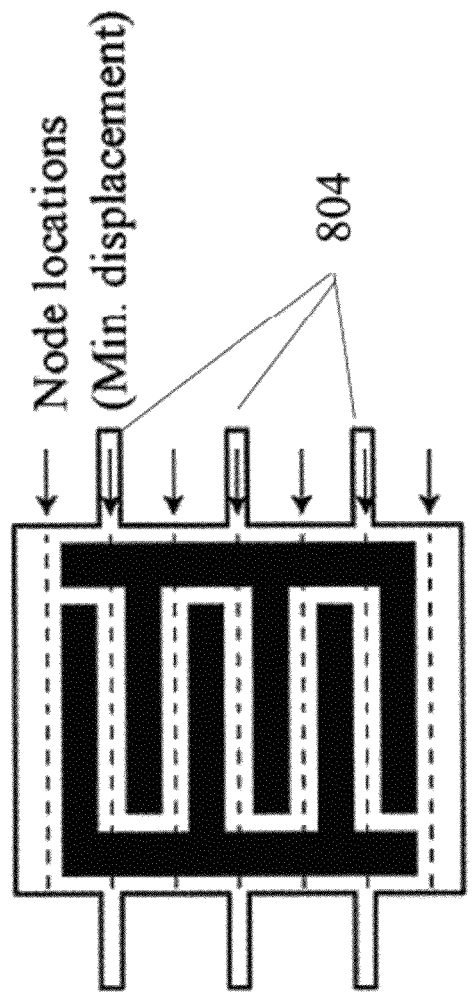

The mechanical resonating structure may have any suitable shape. For example, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Any of the mechanical resonating structure elements may be formed either in whole or in part of the same or different geometries. In addition, several different type geometrical structures may be coupled together to obtain particular resonance mode responses, as described further below. For example, FIG. 8A shows a mechanical resonating structure design with an IDT electrode configuration that allows reduction in coupling of spurious frequencies and their associated modes. In another example illustrated in FIG. 8B, additional anchors 804 may be added to support a mechanical resonating structure. The anchors can be placed at locations of minimum displacement (of the mechanical resonating structure), so that spurious resonator modes can be suppressed. Similarly, geometrical and structural alterations can be made to improve quality (e.g., Q-factor, noise) of the signal generated by the mechanical resonating structure.

In some embodiments, the mechanical resonating structure may include a plurality of resonating elements. At least some of the resonating elements may be coupled to one another. In some of these embodiments, the resonating elements may have different dimensions. For example, the mechanical resonating structure may include at least one major element that has a large dimension that is larger than the large dimension of the minor element. In general, the minor elements have at least one smaller dimension (e.g., length, thickness, width) than the major element. Minor elements can have a shorter length than the major element. The minor elements may have nanoscale (i.e., less than 1 micron) dimensions. In some embodiments, at least one of the dimensions is less than 1 micron; and, in some embodiments, the large dimension (i.e., the largest of the dimensions) is less than 1 micron.

Suitable mechanical resonating structures have been described, for example, in International Publication No. WO 2006/083482, U.S. patent application Ser. No. 12/181,531, filed Jul. 29, 2008, and in U.S. patent application Ser. No. 12/142,254, filed Jun. 19, 2008 and published Oct. 1, 2009 as U.S. Patent Application Publication 2009-0243747, which are incorporated herein by reference in their entireties. It should be understood that a number of different designs for the mechanical resonating structure are also suitable.

FIG. 1 also shows one configuration of IDT electrodes and the resonating structure plate according to some embodiments. Other suitable configurations of electrodes can be employed as shall be discussed in further detail below.

Figure 2A:
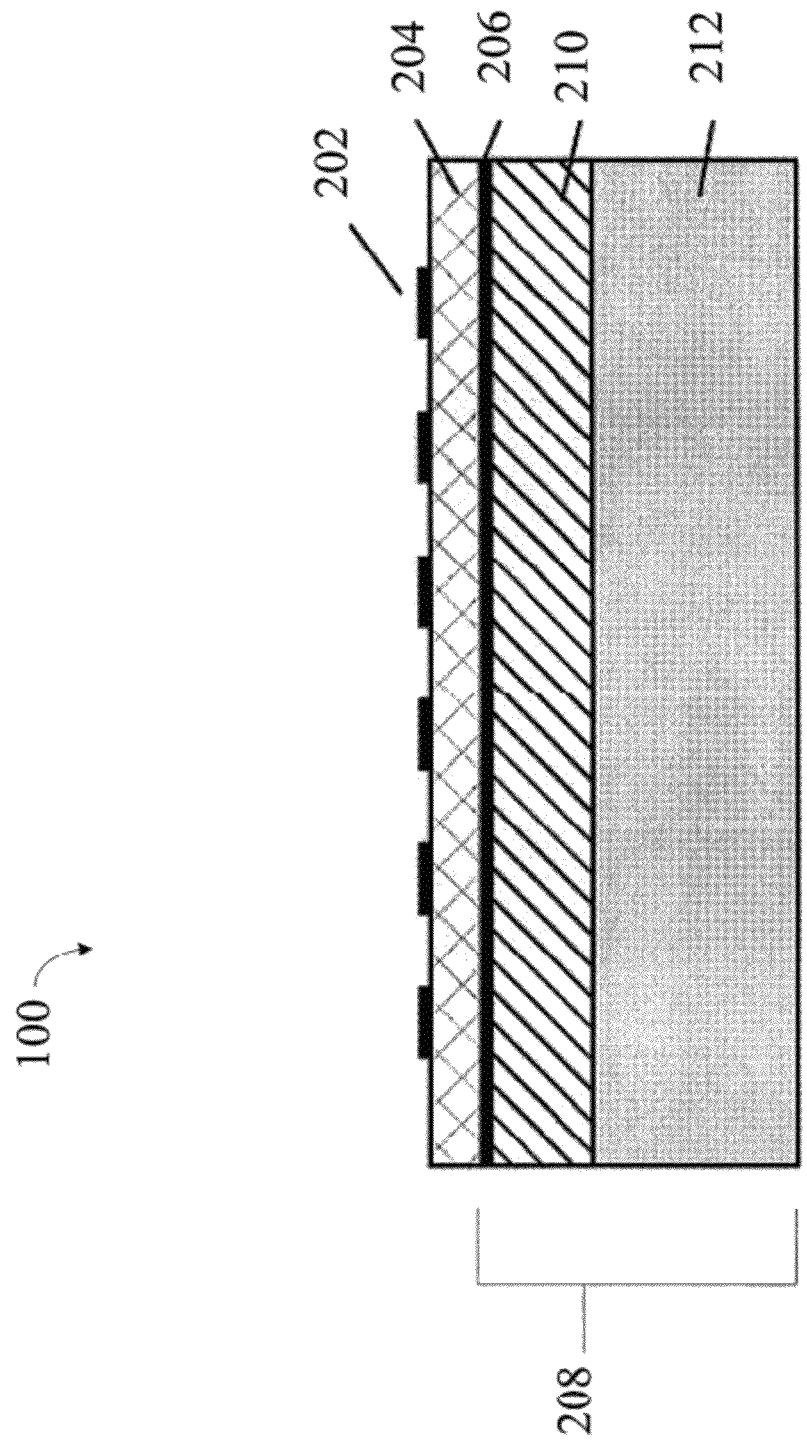
FIG. 2A shows a cross-sectional view of a mechanical resonating structure according to certain embodiments of the present invention.

FIG. 2A illustrates a lateral view of a mechanical resonating structure according to some embodiments. The mechanical resonating structure can be built using several components, layers, and materials including IDT electrodes 202, active layer 204, electrode layer(s) 206 and a compensating structure 208.

The active layer 204 responds to the transduction method used to actuate the mechanical resonating structure (i.e., cause to vibrate) and/or detect motion of the mechanical resonating structure. It should be understood that any transduction method may be used including piezoelectric, piezoresistive, electrostatic, electrostrictive, electromotive, magnetostrictive, magnetomotive, thermal, spin-torque effect, and spin-polarized current driven magnetic excitation, amongst others.

The active layer may have any suitable construction (including composition) which will depend, in part, on the transduction method used for actuation and/or detection. In some embodiments, the active layer is formed of a piezoelectric material. In some embodiments, the active layer is formed of a semiconductor material such as silicon. It should be understood that other compositions are also possible. In some cases, the active layer is formed of multiple layers. For example, the active layer may comprise multiple layers, one or more of which are functional (e.g., piezoelectric) and one or more of which are not.

As noted above, the active layer may be formed of a piezoelectric material. Examples of suitable materials include aluminum nitride (AlN), zinc oxide (ZnO), cadmium sulfide (CdS), quartz, lead titanate ($PbTiO_3$), lead zirconate titanate (PZT), lithium niobate ($LiNbO_3$), and lithium tantalate ($LiTaO_3$). In some embodiments, AlN may be preferred. Most active layer materials (e.g., silicon, piezoelectric materials) normally have a negative temperature coefficient of stiffness (TCS). That is, most active layer materials may become less stiff (also referred to as "softer") as temperature increases over a range. Stiffness, in general, can be associated with a resistance of a material to deform in response to an applied force.

As mentioned, according to one aspect of the present invention, a mechanical resonating structure may comprise a compensation structure, such as the compensation structure 208 of FIG. 2A. The compensation structure may be configured to provide a desired stiffness variation of the mechanical resonating structure and/or frequency of operation variation of the mechanical resonating structure over a desired temperature range (e.g., an anticipated operational temperature range of the mechanical resonating structure) for one or more modes of vibration of interest. In some embodiments, the composition of the active layer of the mechanical resonating structure may be considered in configuring the compensation structure, as the composition of the active layer may impact the stiffness variation of the active layer with temperature, which is to be compensated by the compensation structure in some embodiments. According to one embodiment, the compensation structure may be configured to provide the mechanical resonating structure with a TCF having an absolute value of less than approximately 1 ppm/K over a temperature range of at least 40° C. centered around room temperature (25° C.) for one or more modes of Lamb waves when the active layer is formed of aluminum nitride. However, this is merely a non-limiting example provided for purposes of illustration.

In the illustrated embodiment of FIG. 2A, active layer 204 is formed on compensation structure 208. Other configurations are also possible. For example, in some cases, the compensation structure may be formed on the active layer As shown, compensation structure 208 includes multiple components (e.g., layers). In general, characteristics (e.g., composition, dimensions, and arrangement within the structure) of the components (e.g., layers) are selected such that structure 208 provides the desired compensation with respect to the active layer and any additional layers to be compensated, so that the mechanical resonating structure exhibits a desired behavior across a range of temperatures for any modes of vibration of interest.

In the embodiment shown in FIG. 2A, the compensating structure includes a first layer 210 and a second layer 212. The stiffness of layers 210, 212 may vary differently with temperature. For example, layer 210 may have a stiffness that increases with increasing temperature over a temperature range (i.e., a positive TCS). Layer 212 may have a stiffness that decreases, or stays relatively constant, with increasing temperature over a temperature range (i.e., a negative TCS). As described further below, the arrangement of the first and second layers (e.g., dimensions, location within structure) may be selected to impart the mechanical resonating structures with desired behavior across a range of temperatures. For example, the arrangement may be selected so that the resonating structures have a relatively constant stiffness over a temperature range. That is, the TCS may approach or be equal to 0. This may contribute to minimizing the frequency variation over the temperature range (e.g., TCF may approach or be equal to 0). Thus, it should be appreciated that in some embodiments the temperature compensation structure may compensate for temperature-induced variations in stiffness of layers other than the active layer (but in addition to the active layer in some embodiments) of the mechanical resonating structure, e.g., one layer of the temperature compensation structure may compensate for temperature-induced stiffness variations of another layer of the temperature compensation structure.

It should be understood that, in certain embodiments, the compensating structure may include one or more layers in addition to those shown in FIG. 2A. Some of these embodiments are described further below. The additional layer(s) may have the same composition as one of the first or second layers. In other embodiments, the additional layer(s) may have a different compensation than both the first and second layers.

In some embodiments, the compensation structure may be formed of only a single layer (e.g., first layer 210). In one such embodiment, for example, the active layer may be formed of silicon and the single layer of the compensation structure may be formed of $SiO_2$. In an alternative such embodiment, the active layer may be formed of aluminum nitride (AlN) and the single layer of the compensation structure may be formed of silicon dioxide ($SiO_2$). Other choices for the materials may also be used.

The first layer can have characteristics that are selected so that it has a positive TCS (i.e., TCS>0) over a temperature range. For example, the composition of the first layer may be selected to provide a positive TCS. Suitable compositions can include $SiO_2$ and $Al_2O_3$, amongst others. In some cases, $SiO_2$ may be preferred. In some cases, the first layer may be composed of a series of ultra-thin layers (e.g., less than 10 nm thick) which are combined to produce an overall layer having a positive TCS. The positive TCS may also, or alternatively, be engineered by implanting species (e.g., ions, neutrons) into the first layer. Thus, it should be understood that a layer exhibiting a positive TCS may be obtained in any of a number of suitable ways, and that the various aspects described herein including one or more layers exhibiting a positive TCS are not limited in the manner in which the positive TCS is obtained.

As noted above, first layer 210 can have a positive TCS over a temperature range. In some cases, the TCS is positive across the entire operating temperature range of the device. For example, the TCS may be positive across the temperature range of between −55° C. and 150° C., or between −40° C. and 85° C. However, in other cases, the TCS of first layer 210 may be positive across a portion of the operating range, and negative across other portion(s). The TCS of the first layer may be positive across the majority of the temperature range. In some embodiments, the TCS of the first layer may be positive across a range of at least 200° C.; in some embodiments, at least 100° C.; and, in other embodiments, at least 50° C.

As noted above, second layer 212 may have a different stiffness-temperature dependence than the first layer. The second layer may be a support layer that provides robustness to the first layer. The second layer may be formed of a material having a lower acoustical loss than the material of the first layer. In some embodiments, the second layer is formed of a material having a certain crystal structure. For example, the second layer may be formed of a single crystal material and/or a material having higher crystal quality than the material of the first layer (e.g., lower defects). In particular, when the first layer comprises $SiO_2$, the robustness and support provided by the second layer is useful, since a structure comprised of a thin $SiO_2$ layer(s) and the active layer can be fragile and prone to damage if subjected to forceful mechanical movements or vibrations. The second layer can also provide improved signal performance (e.g., less noise and better Q-factor). Suitable materials for second layer 212 include silicon, diamond, silicon carbide, sapphire, quartz, germanium, aluminum nitride, and gallium arsenide, amongst others. In some embodiments, it is preferable for the second layer to be formed of silicon.

The embodiment of FIG. 2A includes IDT electrodes 202 and an electrode layer 206 to facilitate transfer of charges and electric potential across a mechanical resonating structure. The number of electrodes and placement of electrodes can be important as they can determine the types of acoustic waves and excitation modes generated by the mechanical resonating structure's motion.

Examples of suitable electrode materials include, but are not limited to, aluminum (Al), molybdenum (Mo), titanium (Ti), chromium (Cr), ruthenium (Ru), gold (Au), platinum (Pt) or AlSiCu. In general, any suitable electrode material can be utilized for the electrode layer. In some embodiments, a thin layer of Ti and/or AlN may be added beneath the electrode to enhance crystal orientation of the active (e.g., piezoelectric) material layer.

Figure 2B:
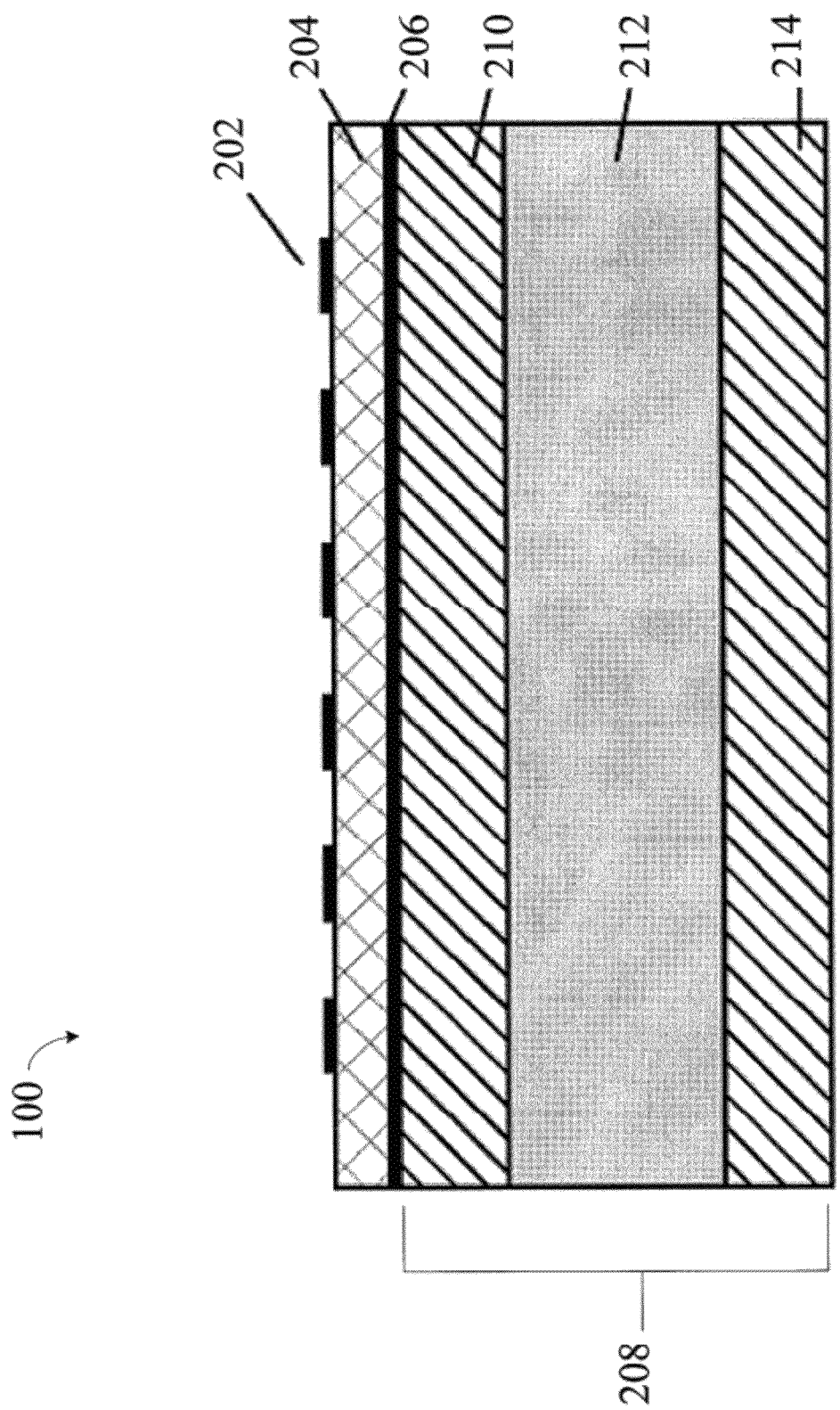
FIG. 2B shows a cross-sectional view of a mechanical resonating structure according to certain embodiments of the present invention.

FIG. 2B illustrates another embodiment in which the compensating structure includes a third layer 214. In some cases, the third layer may be formed of a material having a positive TCS. Suitable materials having a positive TCS were described above in connection with first layer 210. In some embodiments, the third layer comprises the same material as first layer 210. However, in other embodiments, the third layer may comprise a different material than the first layer (and the second layer). In some embodiments, layers 210 and 214 are formed of $SiO_2$ layers. In some of these cases, the second layer 212 is formed of Si. As shown, the second layer is positioned between the first layer and the third layer. Other arrangements are possible.

In some embodiments, the third layer has a similar thickness as the first layer. For example, the ratio of the thickness of the third layer to the thickness of the first layer may be between 1:0.25 and 1:4.0, between 1:0.75 and 1:1.25, or about 1:1. For example, the listed ratios may be suitable when the third layer is formed of the same composition as the first layer (e.g., when the first and third layers are both formed of $SiO_2$, or any other suitable material (e.g., any other suitable positive TCS material)).

In some cases, the three-layer compensation structure configuration illustrated in FIG. 2B may provide enhanced performance as compared to a two-layer compensating structure. For example, such a configuration can reduce the tendency of the resonating structure to bend out of plane by balancing residual stress in the structure. This can provide a high Q, low noise signal. In some embodiments, a split-layer compensation structure similar to that illustrated in FIG. 2B may facilitate fabrication of the structure. For example, as mentioned, in one embodiment the layers 210 and 214 may be formed of the same material (e.g., $SiO_2$). Rather than forming a single layer of the material having a thickness approximately equal to the combined thickness of layers 210 and 214, the configuration of FIG. 2B may be used in which separate layers 210 and 214 are formed. In this manner, fabrication defects associated with forming thick material layers (e.g., cracking, bending, warping, etc.) may be minimized or avoided, as may be out-of-plane deformation of the mechanical resonating structure.

It should be understood that the compensation structure may have a variety of different configurations in addition to those shown in FIGS. 2A and 2B. For example, the compensation structure may include more than three layers. In some cases, the compensation structure may include at least one additional layer having a similar function as second layer 212 described above. The additional one or more layer(s) may be formed of a material having a lower acoustical loss than the material of the first layer including those noted above. In some cases, the additional one or more layer(s) is formed of silicon. As noted above, the compensation structures can be designed to provide the mechanical resonating structure with a desired frequency variation with temperature (e.g., TCF) for one or more modes of interest. In some embodiments, it may be desirable for the TCF to approximate or be equal to zero over a range of temperatures for one or more modes of Lamb waves, or for any other modes of interest. That is, in these cases, the compensating structure can enable the mechanical resonating structure to operate with little or no variation in frequency over a range of temperatures.

However, in some embodiments, it may be desirable for the TCF to be non-zero at least over certain temperature ranges. Thus, in these cases, the frequency of the mechanical resonating structure may vary a desired amount with temperature. In these embodiments, the compensation structure is designed to achieve the desired amount of variation.

In some embodiments, the mechanical resonating structure has an absolute value of a TCF of less than 10 ppm/K over a range of temperatures. For example, the absolute value of the TCF may be less than 10 over an anticipated operating range of the mechanical resonating structure (e.g., from −40° C. to 85° C.). In some embodiments, the absolute value of the TCF is less than 6 ppm/K over a range of temperatures, for example from −40° C. to 85° C. In some embodiments, the absolute value of the TCF over the range of temperatures (e.g., from −40° C. to 85° C.) is less than 5 ppm/K, or less than 3 ppm/K, less than 2 ppm/K or less than 1 ppm/K. In some cases, the TCF may approximately equal 0 (which includes exactly equaling zero) over a range of at least 5° C. or at least 10° C. within the range from −40° C. to 85° C., as a non-limiting example. Other values are also possible. For example, in some embodiments the absolute value of the TCF may be less than 4 ppm/K, less than 1 ppm/K, less than 0.5 ppm/k, or approximately zero, over a range of temperature spanning at least 40° C. (e.g., a range of temperatures spanning at least 40° C. and centered approximately at room temperature, 25° C.).

The range of temperatures over which the desired TCF is achieved may depend on the application. In some cases, the temperature range may be broad. For example, the temperature range may be between −55° C. and 150° C.; or, −40° C. to 85° C. The range may span at least 200° C., at least 100° C., at least 75° C., at least 50° C., or at least 40° C. In other embodiments, the range of temperature over which the desired TCF is achieved may be more narrow. For example, the temperature range may be less than 50° C., less than 25° C., or less than 10° C. In general, the above-noted ranges of temperatures can be centered around any desired temperature. For example, they may be centered around room temperature (i.e., 25° C.), an elevated temperature such as 100° C., or otherwise.

The compensation structure may be designed to result in a mechanical resonating structure with a desired TCF by selecting appropriate characteristics for the compensation structure. For example, the characteristics may include the composition, dimensions, and arrangement of layers within the structure.

In some embodiments, there may be a desired thickness ratio between layers in the structure. In some cases, the thickness of the active layer (e.g., layer 204) and the total thickness of the positive TCS material layer(s) (e.g., layer 210 in FIG. 2A and layers 210, 214 in FIG. 2B) may be selected to provide a desired ratio. The ratio of the thickness of the active layer to the total thickness of the positive TCS material layer(s) may be between 1:1 and 1:500, or between 1:1 and 1:200 in some non-limiting embodiments. In some embodiments, the ratio may be between 1:1 and 1:10, or between 1:4 and 1:8, or between 1:5 and 1:7 (e.g., about 1:6). In some such embodiments, the active layer may be formed of aluminum nitride and the positive TCS material of the compensation structure may be formed of silicon dioxide, although other materials may be used for the active layer and positive TCS material layer, as those listed are merely examples. In embodiments which include more than one layer formed of a positive TCS material, the total thickness of the positive TCS material layer(s) includes the sum of the thickness of all such layers. In embodiments which include a single layer formed of a positive TCS material, the total thickness of the positive TCS material layer(s) is the thickness of that single layer. The above-noted ratios, for example, may be suitable when the positive TCS material in the layer(s) is $SiO_2$ and the active material is a piezoelectric material such as AlN. Other ratios may be suitable depending on the materials used.

In some cases, the thickness of the positive TCS material layer(s) and the thickness of the layer(s) having a lower acoustic loss than the positive TCS material layer(s) (e.g., layer 212) are selected to provide a desired ratio. For example, the ratio of the total thickness of the positive TCS material layer(s) (e.g., the combined thickness of multiple positive TCS layers in those embodiments in which the compensation structure includes multiple positive TCS layers) and the layer(s) having a lower acoustic loss than the positive TCS material layer(s), may be between 1:0.1 and 1:10, 1:0.5 and 1:3, between 1:0.75 and 1:1.25, or between 1:1 and 1:2. The above-noted ratios may be suitable when, for example, the positive TCS material in the layer(s) is $SiO_2$ and the layer(s) having a lower acoustic loss than the positive TCS material layer(s) is/are formed of Si. These ratios may be suitable when the active material is a piezoelectric material such as AlN.

According to some embodiments, the ratio of the thickness of the active layer(s) of the mechanical resonating structure compared to the thickness of any layers of the temperature compensation structure having lower acoustic loss (e.g., layer 212) may be designed to fall within certain ranges. For example, according to one embodiment the ratio of the thickness of the active layer to the total thickness of one or more layers of the temperature compensation structure having lower acoustic loss than the positive TCS layer(s) may be between 1:0.1 and 1:500, and in some embodiments may be between to 1:0.5 and 1:20. Such ratios may be suitable when the active layer comprises, for example, AlN, and the layer of lower acoustic loss material comprises, for example, silicon. Other materials and other ratios may be used, however, as those listed are not limiting.

It should be understood that certain embodiments may include layer thicknesses outside of the above-noted ranges.

Figure 3A:
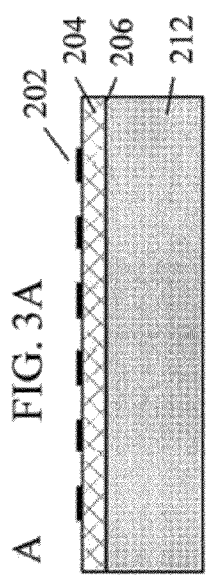
FIG. 3A shows a diagram of an uncompensated mechanical resonating structure with a negatively-sloped temperature coefficient of frequency.
Figure 3B:
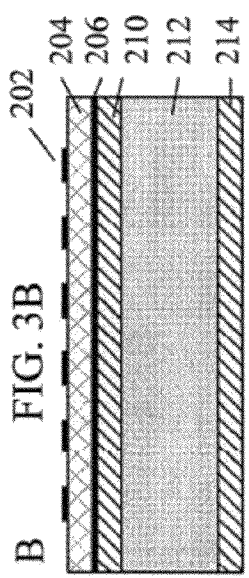
FIG. 3B shows a diagram of a mechanical resonating structure with a negatively-sloped temperature coefficient of frequency according to embodiments of the present invention.
Figure 3C:
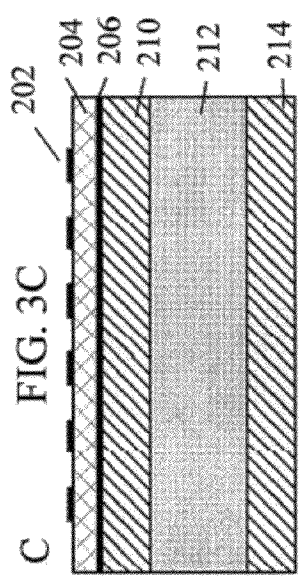
FIG. 3C shows a diagram of a mechanical resonating structure with an approximately zero temperature coefficient of frequency according to embodiments of the present invention.
Figure 3D:
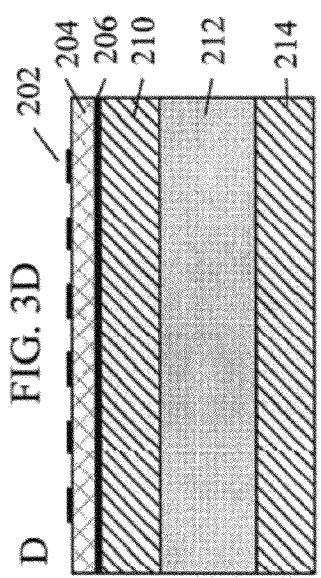
FIG. 3D shows a diagram of a mechanical resonating structure with a positively-sloped temperature coefficient of frequency according to embodiments of the present invention.

FIGS. 2-3D and FIGS. 3H-3J illustrate some embodiments of the invention. Other configurations of a mechanical resonating structure can be utilized. For example, FIGS. 4A-4C illustrate 3 different configurations of a mechanical resonating structure. As shown in FIG. 4A, a top electrode 202A can be placed on top of active layer 204 (e.g., AlN). The compensating structure can be situated below the active layer with IDT electrodes 202 located at an interface of the compensating structure and the active layer. The compensating structure can be a Si layer 212 placed between two $SiO_2$ layers 210, 214 of equal thickness. FIG. 4A illustrates a configuration in which the IDT electrodes are not placed on the top surface of the mechanical resonating structure and in which the active layer is planarized. In contrast, FIG. 4B illustrates a similar structure to FIG. 4A with a difference that the top electrode and active layer are not planarized. FIG. 4C also illustrates a configuration similar to FIG. 4A; however, in contrast to FIG. 4A, the IDT electrodes in FIG. 4C are embedded in a first $SiO_2$ layer of the compensating structure.

Figure 4A:
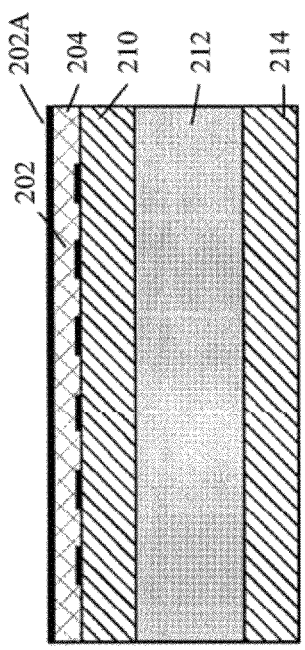
FIG. 4A shows a diagram of a planarized configuration of a mechanical resonating structure according to embodiments of the present invention.
Figure 4B:
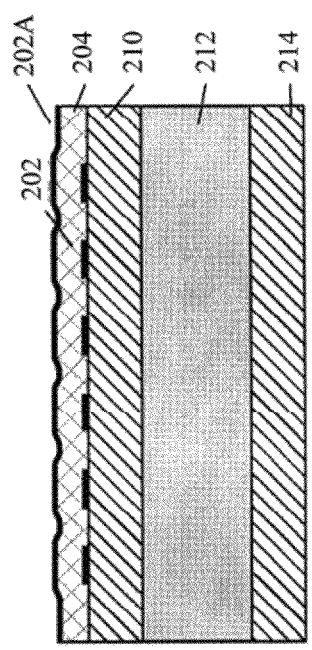
FIG. 4B shows a diagram of a non-planarized configuration of a mechanical resonating structure according to embodiments of the present invention.
Figure 4C:
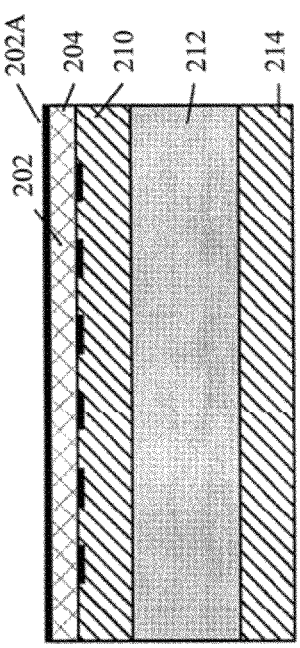
FIG. 4C shows a diagram of a configuration of a mechanical resonating structure according to embodiments of the present invention.
Figure 5A:
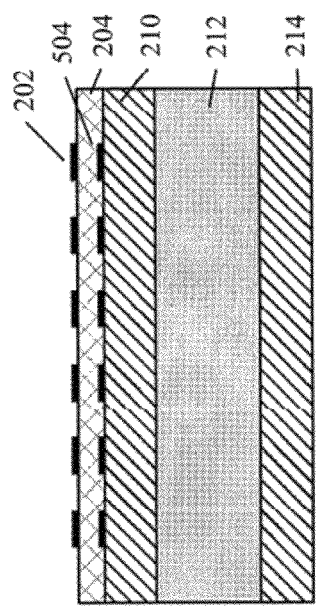
FIG. 5A shows a diagram of a planarized configuration of a mechanical resonating structure with top and bottom electrodes according to embodiments of the present invention.
Figure 5B:
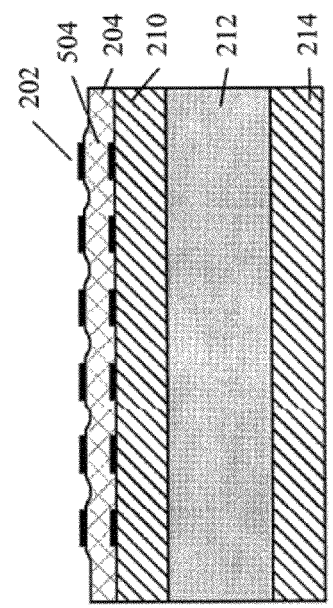
FIG. 5B shows a diagram of a non-planarized configuration of a mechanical resonating structure with top and bottom electrodes according to embodiments of the present invention.
Figure 5C:
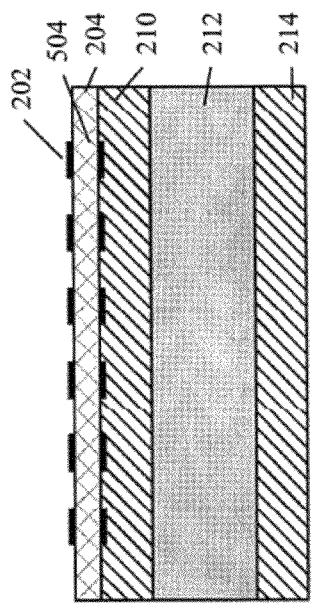
FIG. 5C shows a diagram of a configuration of a mechanical resonating structure with top and bottom electrodes according to embodiments of the present invention.

FIGS. 5A-5C illustrate another set of embodiments in which top 202 and bottom 504 IDT electrodes are used in a mechanical resonating structure. For example, in FIG. 5A, bottom electrodes are placed within the active layer 204 at an interface with the compensating structure as in FIGS. 4A and 4B. However, an additional set of top IDT electrodes are deposited on the top surface of the active layer. FIG. 5B illustrates a non-planarized structure as compared to the planarized structured in FIG. 5A. FIG. 5C shows the bottom IDT electrodes being situated within the first $SiO_2$ layer 210 of the compensating structure. As can be appreciated from the descriptions of FIGS. 4A-5C, various configurations of a mechanical resonating structure with zero TCS can be designed and utilized.

A mechanical resonating structure can be manufactured using simple fabrication processes. As an example, FIGS. 6A-6G and FIGS. 7A-7F illustrate two possible processes used to fabricate a mechanical resonating structure according to embodiments of the invention. It should be understood that other fabrication techniques are also possible including techniques in which the specific process steps are re-arranged in a different order.

Figure 6A:
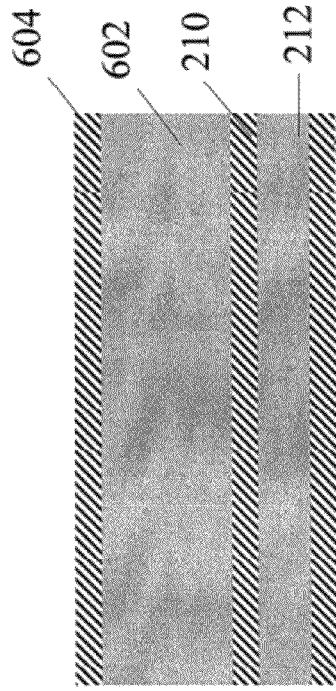
FIGS. 6A-6G illustrate steps for fabricating a mechanical resonating structure using a first method according to embodiments of the present invention.

A first fabrication process is shown in FIGS. 6A-6G. Structure 600A, including a handle layer 602, a first layer 210 with a stiffness that increases with temperature (e.g., $SiO_2$ or any suitable oxide layer), and a second layer 212 with a stiffness that decreases with temperature (e.g., Si), can be used to commence the fabrication process. As shown in FIG. 6A, the first layer can be buried between the handle layer and the second layer. In some embodiments, the handle and second layers can be Si layers.

Figure 6B:
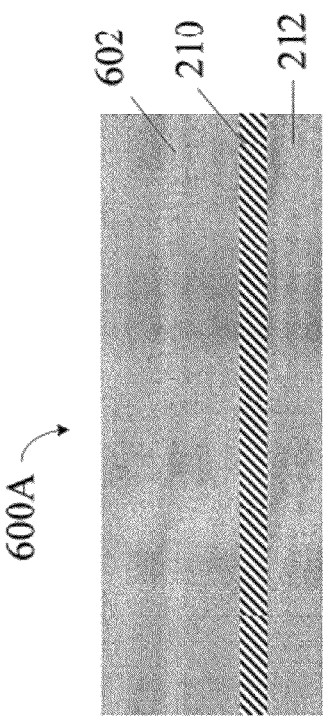
Figure 6C:
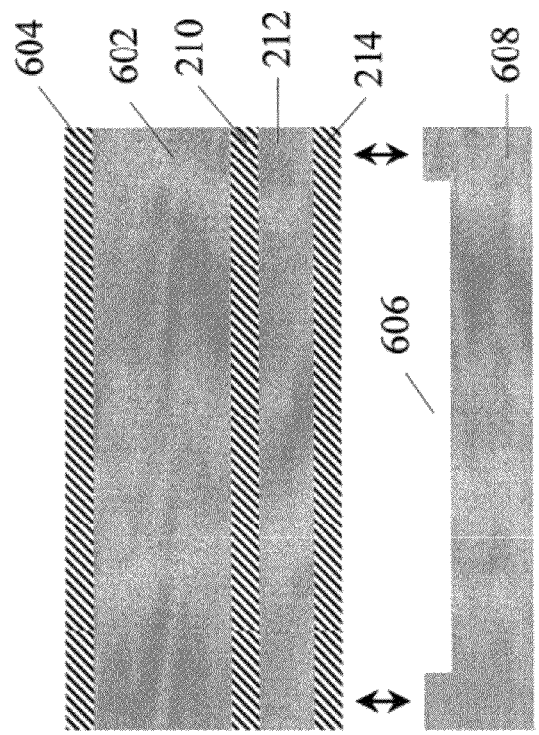
Figure 6D:
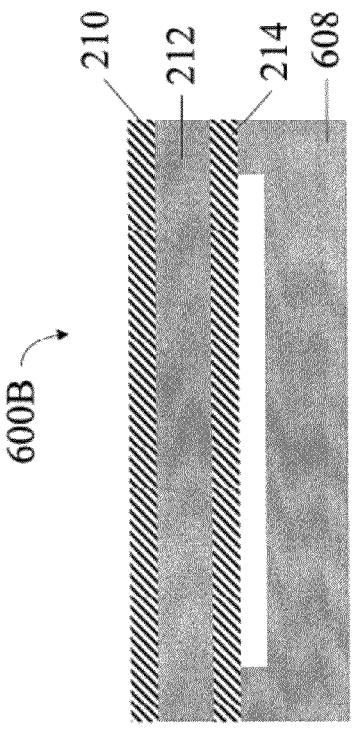
Figure 6E:
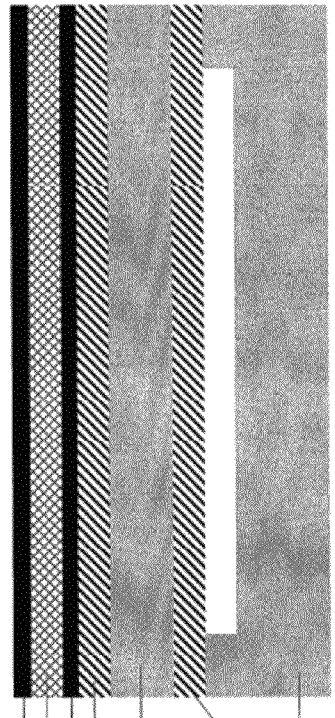
Figure 6F:
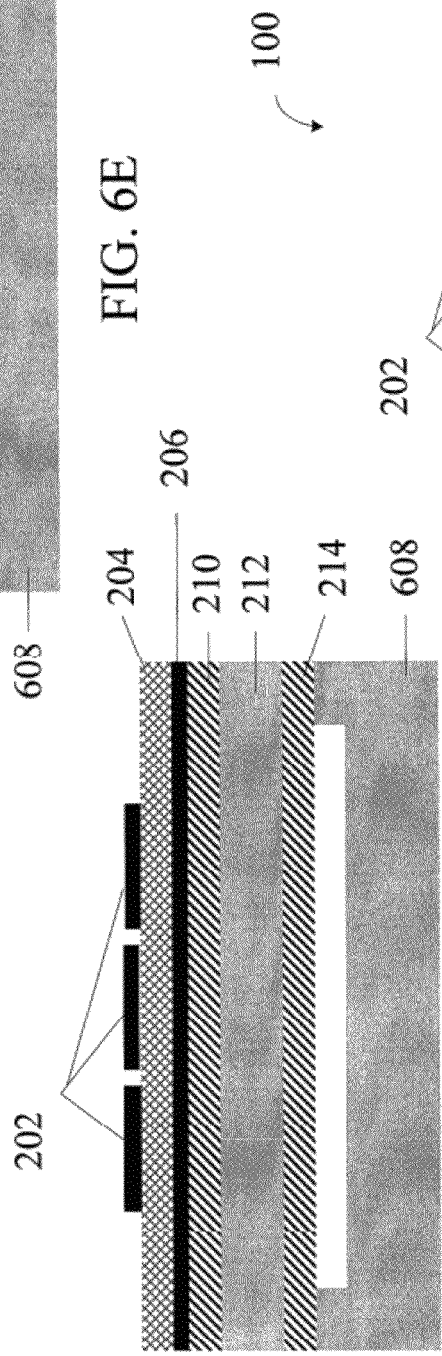
Figure 6G:
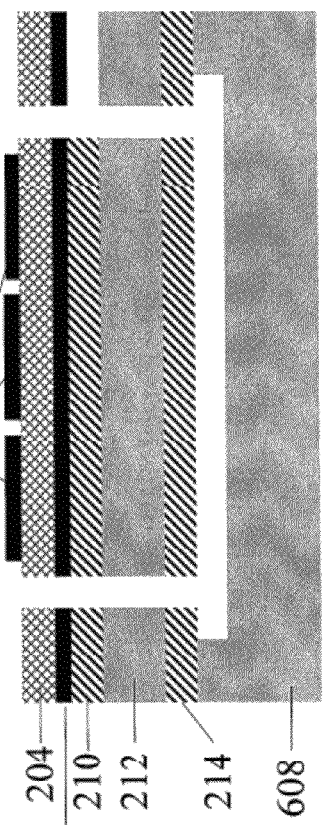

Next, as shown in FIG. 6B, thermal oxide layers 604, 214 can be formed on a top surface of the handle layer and a bottom surface of the second layer using a suitable thermal oxidation procedure. The added thermal oxide layers can be similar to a thickness of the buried first layer 210. Subsequently, a wafer 608 with cavity 606 can be bonded to structure 600A, as illustrated in FIG. 6C. Bonding the wafer to structure 600A yields a modified structure 600B with a pre-defined cavity. Subsequently, as illustrated in FIG. 6D, the handle layer 602 and oxide layer 604 can be removed and a planarized top first layer may be formed using any suitable planarization procedure (e.g., chemical mechanical planarization (CMP). After the planarization process, a bottom electrode layer 206, an active layer 204 and a top electrode layer 202A can be deposited on the top, planarized surface of first layer 210 (FIG. 6E). Suitable deposition techniques include, for example, chemical vapor deposition (CVD) and physical vapor deposition (PVD). In general, any suitable deposition technique can be used. Portions of the top electrode layer can then be selectively removed using any suitable photolithography process. The selective removal can result in formation of IDT electrodes 202 as shown in FIG. 6F. As a next step, the active layer, the electrode layer, the first layer, the second layer and the oxide layer can be etched until the cavity is reached to yield a suspended resonating structure 100 as shown in FIG. 6G. Anchors and other components (e.g., pads, vias) compensating the suspended resonating structure are not shown in FIG. 6G.

Figure 7E:
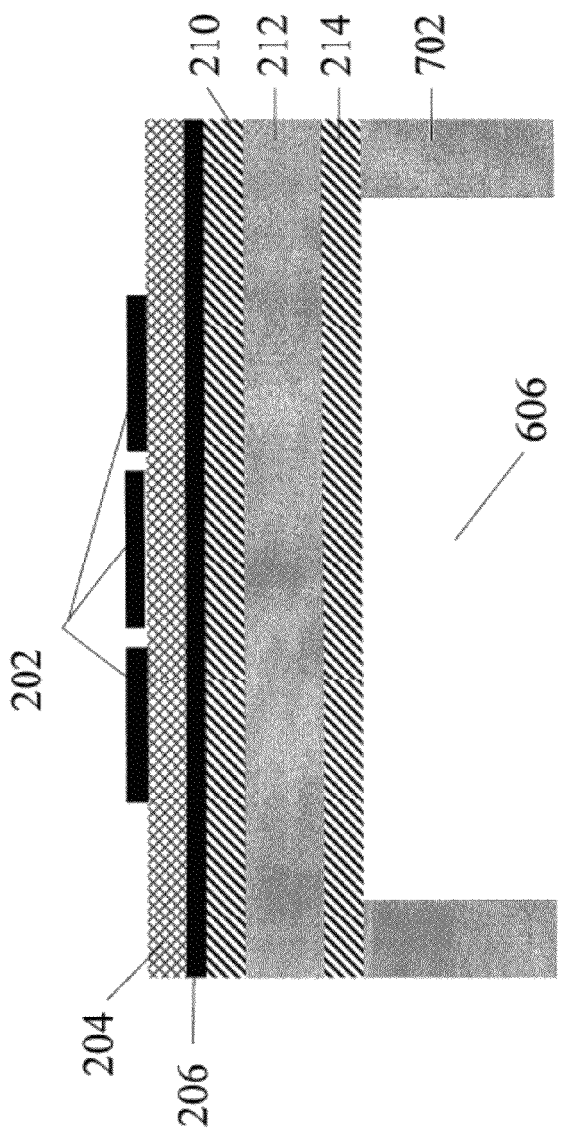
Figure 7F:
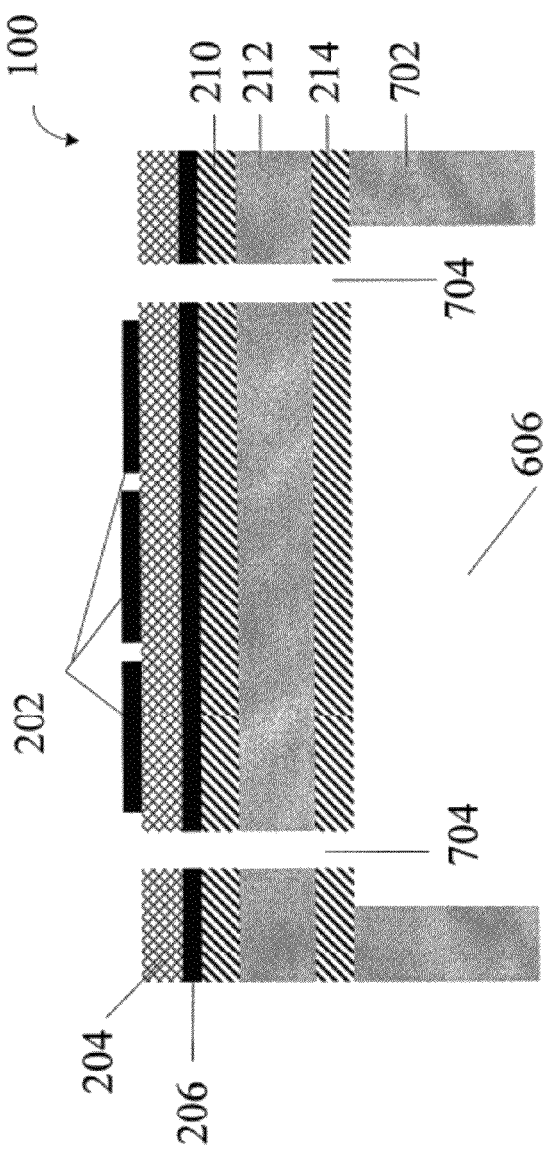

FIGS. 7A-7F illustrate another process that can be used to fabricate a mechanical resonating structure according to some embodiments. Like the first process, a structure 700A with a handle layer 702, an oxide layer 214 and a second layer 212 with a stiffness that decreases with temperature (e.g., Si) can be used to commence the fabrication process. A first layer 210 with a stiffness that increases with temperature (e.g., $SiO_2$ or any suitable oxide layer), a bottom electrode layer 206, a active layer 204 and a top electrode layer 202A can be deposited on the second layer as shown in FIGS. 7B and 7C. The first layer 210 can have the same thickness as oxide layer 214. Examples of suitable deposition techniques have been described above. Subsequently, the top electrode layer is partially removed to form IDT electrodes 202 as described above and shown in FIG. 7D. Using a bottom-up dry or wet etch process, the handle layer is selectively etched to the bottom surface of oxide layer 214 to form a cavity 606 as shown in FIG. 7E. Further etching 704 of the active layer, the bottom electrode layer, the second layer, the first layer and the oxide layer can result in a suspended resonating structure 100 illustrated in FIG. 7F.

It should be understood that other configurations and/or fabrication processes can be used for a mechanical resonating structure.

The mechanical resonating structures described herein can be incorporated into a variety of devices. According to some embodiments, a mechanical resonating structure can be integrated in tunable meters, mass sensors, gyros, accelerometers, switches, and electromagnetic fuel sensors. According to some embodiments, the mechanical resonating structure can be integrated in a timing oscillator. Timing oscillators can be used in several devices including digital clocks, radios, computers, oscilloscopes, signal generators, and cell phones. Timing oscillators can precisely generate clock signals, for example, as a reference frequency to help synchronize other signals that are received, processed, or transmitted by a device in which the timing oscillator is integrated. In some scenarios, multiple processes are run simultaneously on a device and the execution of such processes rely on a clock signal that can be generated by the mechanical resonating structure. According to some embodiments, a mechanical resonating structure can also be coupled to additional circuitry. For example, additional circuitry may include filters, mixers, dividers, amplifiers or other application specific components and devices.

Figure 10A:
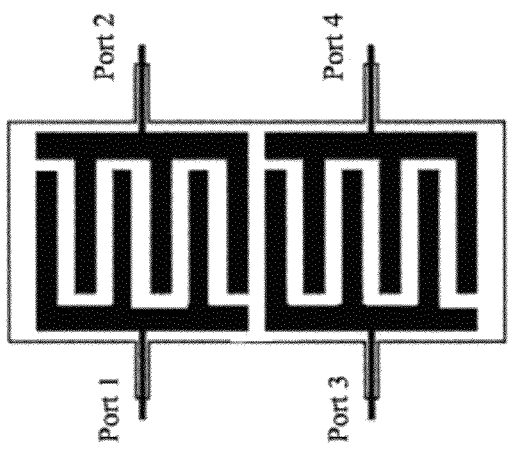
FIGS. 10A-10B illustrate a four-port mechanical resonating structure according to embodiments of the present invention.
Figure 10B:
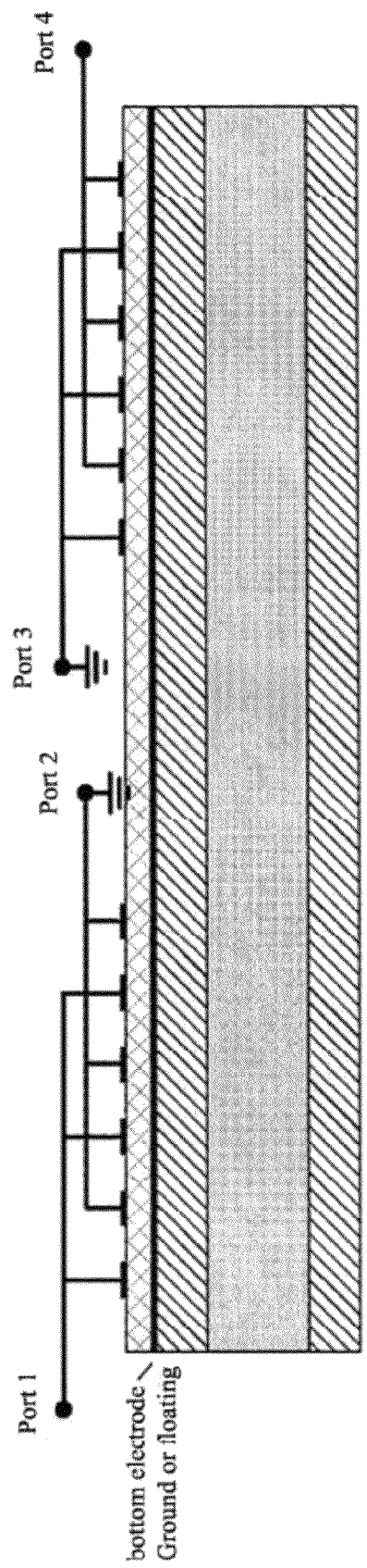

In some embodiments, the mechanical resonating structure can be used as a multiple port device. For example, as illustrated in FIGS. 9A and 9B, the bottom electrode can be grounded, while the IDT electrodes are coupled to two ports, namely Port 1 and Port 2. Alternatively, the bottom electrode could be a floating node. In another example illustrated in FIGS. 10A and 10B, a dual mechanical resonating structure can be utilized to create a four-port mechanical resonating structure device. In the dual mechanical resonating structure configuration, two mechanical resonating structures can be implemented on the same resonating structure plate and the ports can be connected to the desired inputs and outputs.

The following example is provided for illustration purposes and is not intended to be limiting.

EXAMPLE

The following is an example that illustrates that the TCF of a mechanical resonating structure can be controlled according to the methods described herein with reference to FIGS. 3A-3J. In this example, layers 210, 214 are formed of $SiO_2$ and layer 212 is formed of Si.

Figure 3E:
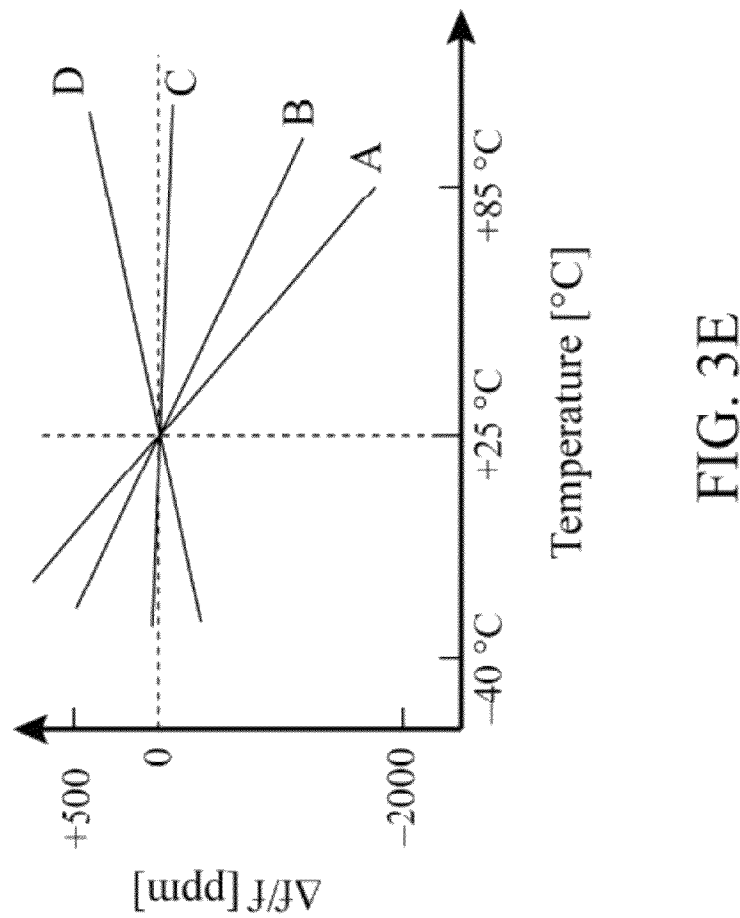
FIG. 3E shows a graph of the normalized frequency variation ($\Delta f/f$) versus temperature of the mechanical resonating structures in FIGS. 3A-3D as a function of temperature according to embodiments of the present invention.

FIG. 3E is an indicator of how the TCF varies as a function of temperature. Specifically, FIG. 3E shows a graph of the normalized frequency variation ($\Delta f/f$) versus temperature. The TCF corresponds to the slope of this curve. As noted above, the active layer can have a negative TCF, and $SiO_2$ can have a positive TCF for a specified range of temperatures.

FIG. 3A shows an example of a mechanical resonating structure with an active layer (e.g., AlN), a bottom electrode, a Si layer 212 and no $SiO_2$ layers. This structure has a negative TCF of approximately −30 ppm/K (illustrated by line A in FIG. 3E). FIG. 3B shows an example of a mechanical resonating structure with a Si layer placed between two $SiO_2$ layers as discussed above. The $SiO_2$ layers have a relatively small thickness compared to the Si layer and to corresponding $SiO_2$ layers in FIGS. 3B and 3C. As illustrated by line B in FIG. 3E, the low thickness can result in a TCF that is still negative but greater (i.e., less negative) than the TCF of the mechanical resonating structure in FIG. 3A. The structure shown in FIG. 3C is similar to the mechanical resonating structure in FIG. 3B; however, in FIG. 3C, both $SiO_2$ layers have greater thicknesses. The corresponding line, C, in FIG. 3E indicates an almost zero TCF for the mechanical resonating structure in FIG. 3C. If the thickness of the $SiO_2$ layers is further increased, as shown in FIG. 3D, then the TCF of the mechanical resonating structure becomes non-zero and positive, as shown by D in FIG. 3E. Accordingly, in these embodiments, the thinner the thickness of the $SiO_2$ layers, the more negative the TCF of the mechanical resonating structure.

Figure 3F:
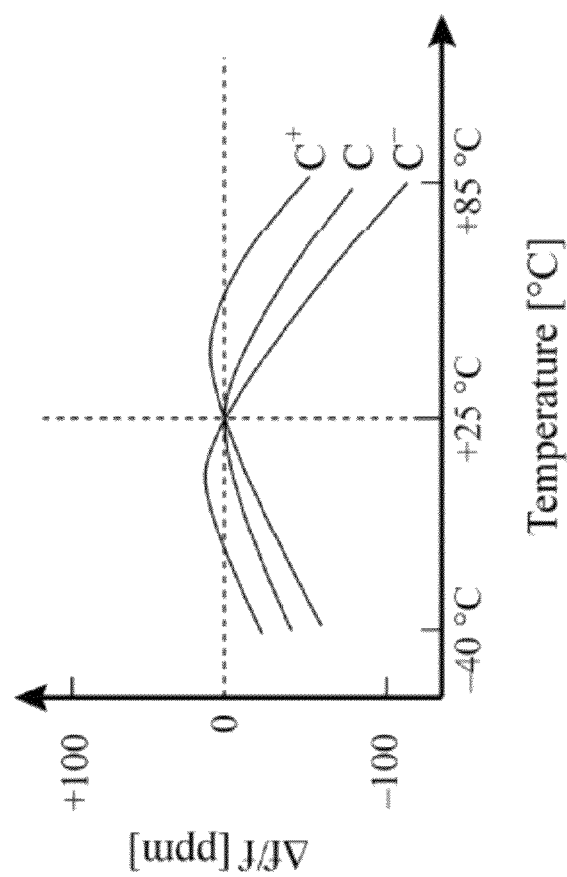
FIG. 3F shows a graph of a mechanical resonating structures' non-linear temperature coefficient of frequency behavior according to embodiments of the present invention.

While FIG. 3E illustrates an example of how the normalized frequency variation ($\Delta f/f$) over temperature can be 'leveled' and, therefore, the TCF approaches zero over a range of temperatures by selecting appropriate thicknesses for layers of a mechanical resonating structure device, in certain cases it may be more challenging to achieve a flat response over a broad range of temperatures (e.g., −40° C. to 85° C.), since many materials have non-linear TCF properties. For example, some materials may have higher order TCF properties. For such materials, the mechanical resonating structure may be designed and/or tuned to provide zero TCF properties around the operating temperature (e.g., room temperature) or any other desired/pre-determined temperature of the mechanical resonating structure. For example, as illustrated in FIG. 3F, a non-linear curve C can have a zero TCF at room temperature (i.e., 25° C.) if suitable thicknesses are chosen for the mechanical resonating structure layers. If, for example, a slightly thicker $SiO_2$ layer is used, a zero TCF can be achieved at a temperature greater than room temperature, as indicated by curve $C^+$; however, if a slightly thinner $SiO_2$ layer is used, a zero TCF can be achieved at a temperature lower than room temperature, as indicated by curve $C^-$.

Figure 3G:
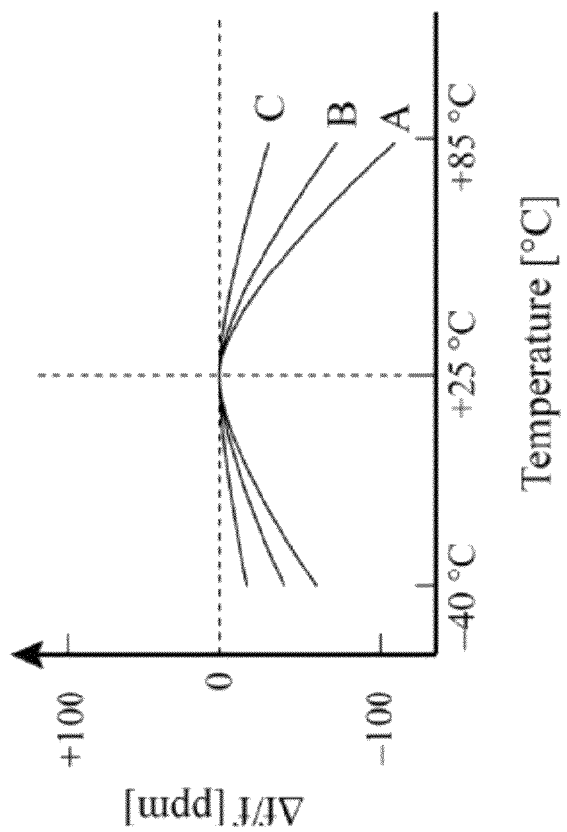
FIG. 3G shows a graph of a mechanical resonating structures' non-linear temperature coefficient of frequency behavior where all the structures have a zero temperature coefficient of frequency at room temperature according to embodiments of the present invention.

The thicknesses of the mechanical resonating structure layers may not only determine where a zero TCF is achieved in a broad range of temperatures, but may also help reduce the higher-order nature of the mechanical resonating structure layers' non-linear TCF properties. FIG. 3G, for example, shows the parabolic TCF profile of three mechanical resonating structures A, B and C illustrated in FIGS. 3H-3J. Structure C has a smaller $Si/SiO_2$ layer thickness than structure B, which has a smaller $Si/SiO_2$ layer thickness than structure A. Due to differences in a ratio of the thickness of the active material to the thickness of the Si layer and/or the $SiO_2$ layers, the parabolic profile of all three structures can be different despite having a zero TCF at room temperature. For example, as shown in FIG. 3G, since structure A has the thickest $SiO_2$ layers, structure A maintains its higher order characteristic with a severely parabolic TCF profile as shown by curve A. In comparison, curve B has a less parabolic TCF profile. Curve B corresponds to structure B, which has smaller $SiO_2$ layer thickness than structure A. Similarly, as shown by curve C, structure C has the least parabolic TCF profile since structure C has the thinnest $SiO_2$ layers.

It should be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present to invention, but not necessarily in all embodiments. Consequently, appearances of the phrases "in one embodiment," "in an embodiment," or "in some embodiments" in various places throughout the Specification are not necessarily referring to the same embodiment. Furthermore, the particular features, structures, materials, or characteristics can be combined in any suitable manner in one or more embodiments.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A mechanical resonating structure, comprising:
   an active layer; and
   a compensating structure coupled to the active layer,
   wherein the compensating structure comprises first, second and third layers of materials, wherein the first and third layers of materials have a stiffness that increases with increasing temperature over a temperature range, and
   wherein the mechanical resonating structure is configured to support Lamb waves.

2. The mechanical resonating structure of claim 1, wherein the active layer comprises a piezoelectric material.

3. The mechanical resonating structure of claim 1, wherein a ratio of a thickness of the active layer to a combined thickness of the first and third layers is between 1:1 and 1:200.

4. The mechanical resonating structure of claim 3, wherein the ratio of the thickness of the active layer to the combined thickness of the first and third layers is between 1:1 and 1:10.

5. The mechanical resonating structure of claim 1, wherein the temperature range is from −40° C. to 85° C.

6. A mechanical resonating structure, comprising:
   an active layer; and
   a compensating structure coupled to the active layer,
   wherein the compensating structure comprises three layers of materials, wherein at least two of the three layers of materials have a stiffness that varies according to a change in temperature over a temperature range, and
   wherein the mechanical resonating structure is configured to support Lamb waves, and
   wherein each of the three layers of materials of the compensating structure is configured to vibrate in response to actuation of the active layer.

7. The mechanical resonating structure of claim 6, wherein the active layer comprises a piezoelectric material.

8. The mechanical resonating structure of claim 6, wherein each of the at least two of the three layers has a stiffness that increases with increases in temperature, and wherein a ratio of a thickness of the active layer to a combined thickness of the at least two of the three layers is between 1:1 and 1:200.

9. The mechanical resonating structure of claim 8, wherein the ratio of the thickness of the active layer to the combined thickness of the at least two of the three layers is between 1:1 and 1:10.

10. A mechanical resonating structure, comprising:
    an active layer; and
    a multi-layer compensation structure comprising multiple layers configured to provide the mechanical resonating structure with a temperature coefficient of frequency having an absolute value less than 10 ppm/K over a temperature range from −40° C. to 85° C.

11. The mechanical resonating structure of claim 10, wherein the multi-layer compensation structure is configured to provide the mechanical resonating structure with a temperature coefficient of frequency having an absolute value less than 6 ppm/K over the temperature range from −40° C. to 85° C.

12. The mechanical resonating structure of claim 11, wherein the multi-layer compensation structure is configured to provide the mechanical resonating structure with a temperature coefficient of frequency having an absolute value less than 3 ppm/K over the temperature range from −40° C. to 85° C.

13. The mechanical resonating structure of claim 12, wherein the multi-layer compensation structure is configured to provide the mechanical resonating structure with a temperature coefficient of frequency having an absolute value less than 1 ppm/K over the temperature range from −40° C. to 85° C.

14. The mechanical resonating structure of claim 10, wherein the active layer comprises a piezoelectric material, and wherein the mechanical resonating structure is a suspended mechanical resonating structure coupled to a substrate by at least one anchor.

15. A mechanical resonating structure, comprising:
    an active layer formed, at least in part, of a piezoelectric material;
    a first patterned electrode disposed on a first surface of the active layer;
    a second electrode formed on a second surface of the active layer; and
    a multi-layer compensation structure comprising at least three layers, the multi-layer compensation structure coupled to the active layer,
    wherein the mechanical resonating structure is a suspended mechanical resonating structure coupled to a substrate by at least one anchor,
    wherein each of the at least three layers of the multi-layer compensation structure is configured to vibrate in response to actuation of the active layer, and
    wherein the mechanical resonating structure is configured to support Lamb waves.

16. The mechanical resonating structure of claim 15, wherein the active layer comprises aluminum nitride.

* * * * *

UNITED STATES PATENT AND TRADEMARK OFFICE
CERTIFICATE OF CORRECTION

PATENT NO. : 8,937,425 B2  
APPLICATION NO. : 13/313511  
DATED : January 20, 2015  
INVENTOR(S) : David M. Chen et al.

Page 1 of 1

It is certified that error appears in the above-identified patent and that said Letters Patent is hereby corrected as shown below:

On the Title Page:

In item 63 (Related U.S. Application Data), delete "Continuation of application No. 13/290,385, filed on Nov. 7, 2011, which is a continuation of application No. 12/639,161, filed on Dec. 16, 2009, now Pat. No. 8,058,769, application no. 13/313,511, which is a continuation of application No. 13/290,405, filed on Nov. 7, 2011."

and replace it with:

--Continuation of application No. 13/290,385, filed on Nov. 7, 2011, which is a continuation of application No. 12/639,161, filed on Dec. 16, 2009, now Pat. No. 8,058,769. Continuation of application No. 13/290,405, filed on Nov. 7, 2011, which is a continuation of application No. 12/639,161, filed on Dec. 16, 2009, now Pat. No. 8,058,769.--.

In the Claims:

At column 16, line 12, claim 10, delete "10 ppm/K over" and replace it with --10 ppm/K at all temperatures over--.

Signed and Sealed this  
Second Day of June, 2015

Michelle K. Lee  
*Director of the United States Patent and Trademark Office*